(12) United States Patent
Voss et al.

(10) Patent No.: US 11,721,616 B2
(45) Date of Patent: Aug. 8, 2023

(54) SEMICONDUCTOR PACKAGE WITH SIGNAL DISTRIBUTION ELEMENT

(71) Applicant: Infineon Technologies Austria AG, Villach (AT)

(72) Inventors: Stephan Voss, Munich (DE); Edward Fuergut, Dasing (DE); Martin Gruber, Schwandorf (DE); Andreas Huerner, Nuremberg (DE); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 176 days.

(21) Appl. No.: 16/892,773

(22) Filed: Jun. 4, 2020

(65) Prior Publication Data

US 2021/0384111 A1    Dec. 9, 2021

(51) Int. Cl.
*H01L 23/495*    (2006.01)
*H01L 23/00*    (2006.01)
*H01L 25/07*    (2006.01)

(52) U.S. Cl.
CPC .. *H01L 23/49562* (2013.01); *H01L 23/49503* (2013.01); *H01L 23/49575* (2013.01); *H01L 24/48* (2013.01); *H01L 25/072* (2013.01); *H01L 2224/48091* (2013.01); *H01L 2224/48247* (2013.01); *H01L 2924/10272* (2013.01); *H01L 2924/13091* (2013.01)

(58) Field of Classification Search
CPC ......... H01L 23/49562; H01L 23/49503; H01L 23/49575; H01L 24/48; H01L 25/072
See application file for complete search history.

(56) References Cited

U.S. PATENT DOCUMENTS

| | | | |
|---|---|---|---|
| 10,665,398 B1* | 5/2020 | Namuduri | H01L 25/072 |
| 2013/0154071 A1* | 6/2013 | Haigh | H01L 23/49531 |
| | | | 257/676 |
| 2014/0218885 A1* | 8/2014 | Hosseini | H01L 23/50 |
| | | | 361/767 |
| 2017/0025335 A1 | 1/2017 | Liu et al. | |

\* cited by examiner

*Primary Examiner* — Marc Anthony Armand
(74) *Attorney, Agent, or Firm* — Murphy, Bilak & Homiller, PLLC

(57) ABSTRACT

A semiconductor package includes a die pad comprising a die attach surface, a first lead extending away from the die pad, one or more semiconductor dies mounted on the die attach surface, the one or more semiconductor dies comprising first and second bond pads that each face away from the die attach surface, and a distribution element that provides a first transmission path for a first electrical signal between the first lead and the first bond pad of the one or more semiconductor dies and a second transmission path for the first electrical signal between the first lead and the second bond pad of the one or more semiconductor dies. The distribution element comprises at least one integrally formed circuit element that creates a difference in transmission characteristics between the first and second transmission paths.

19 Claims, 8 Drawing Sheets

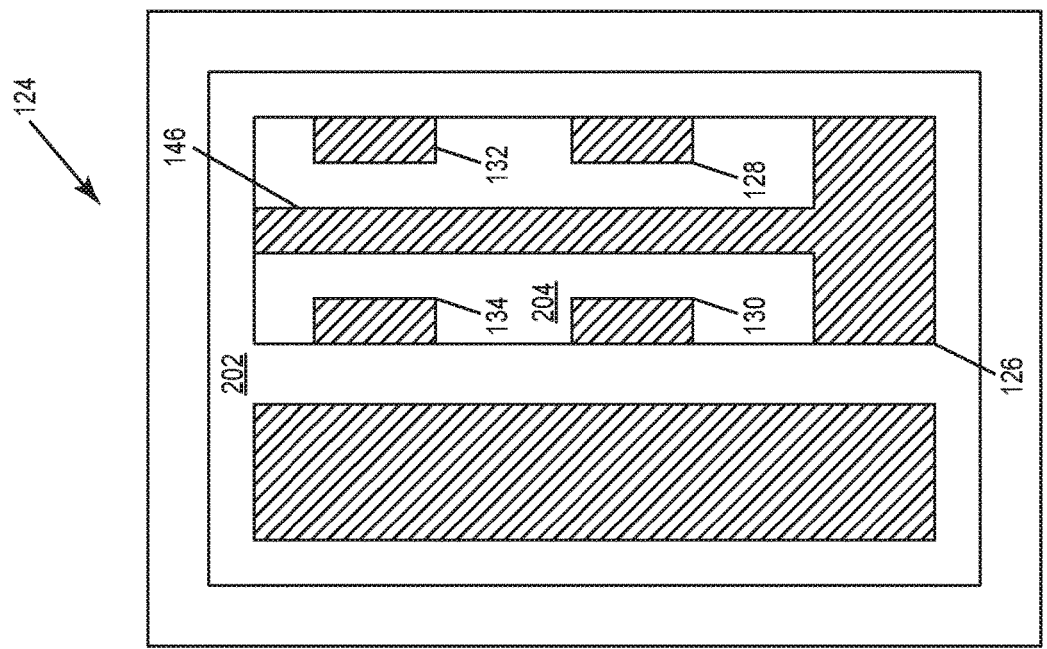
FIG. 2B
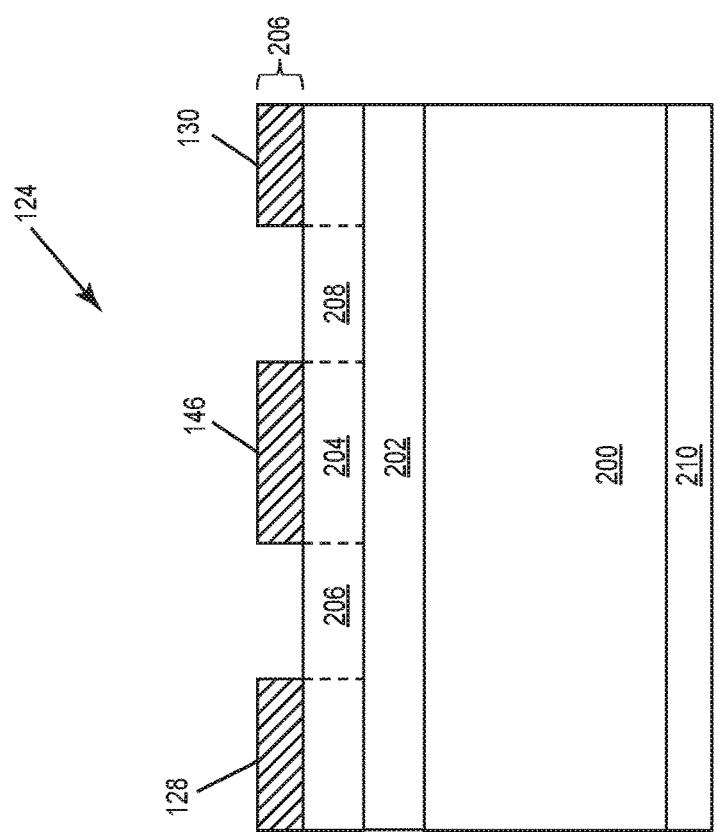
FIG. 2A
FIGURE 2

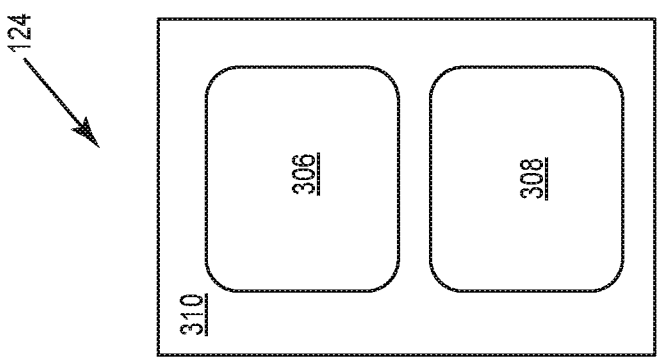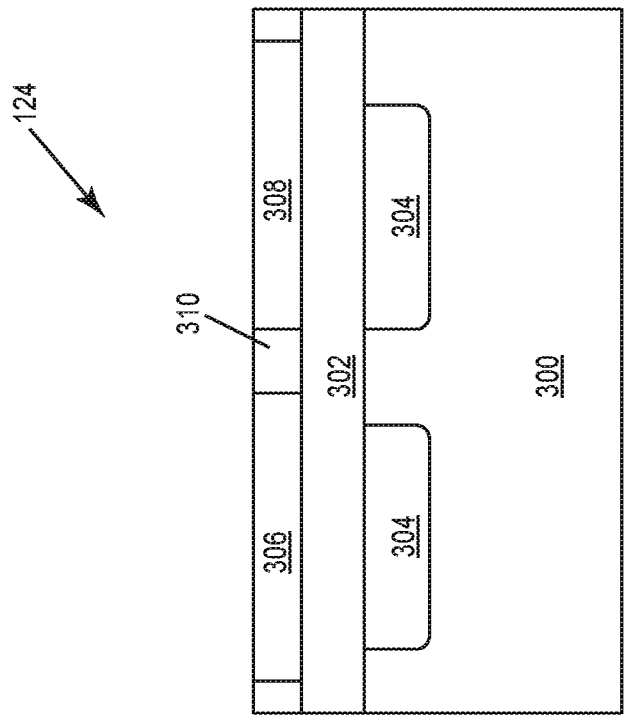
FIG. 3A
FIG. 3B
FIGURE 3

SEMICONDUCTOR PACKAGE WITH SIGNAL DISTRIBUTION ELEMENT

TECHNICAL FIELD

The instant application relates to semiconductor packaging, and more particularly to interconnect techniques for transmitting a signal from a package lead to device terminals of a semiconductor die.

BACKGROUND

Discrete high-voltage semiconductor devices such as MOSFETs (metal oxide semiconductor field effect transistors), IGBTs (insulated gate bipolar transistors), diodes, etc., are commonly packaged in a molded semiconductor package that includes several leads protruding out an encapsulant body. Silicon carbide (SiC) based technology is popular in high-voltage switching applications because it offers performance benefits such as high voltage blocking capability and low on-resistance RON. One drawback to SiC technology is relatively lower yields at larger die sizes. This issue can be addressed using two smaller SiC based semiconductor dies in a single package, wherein the devices are connected in parallel with one another. This parallel configuration enhances current carrying capability while maintaining acceptable yield. However, one challenge associated with these parallel device configurations is ensuring homogeneous signal distribution throughout the semiconductor package. Parasitic effects such as stray inductance between the electrical connection elements (e.g., bond wires) can prevent each device from receiving the same signal (e.g., a gate signal) at the same time and/or with the same magnitude. This can lead to asymmetric operation of the devices, which in turn results in large and potentially damaging currents in one of the two devices.

SUMMARY

A semiconductor package is disclosed. According to an embodiment, the semiconductor package includes a die pad comprising a die attach surface, a first lead extending away from the die pad, one or more semiconductor dies mounted on the die attach surface, the one or more semiconductor dies comprising first and second bond pads that each face away from the die attach surface, and a distribution element that provides a first transmission path for a first electrical signal between the first lead and the first bond pad of the one or more semiconductor dies and a second transmission path for the first electrical signal between the first lead and the second bond pad of the one or more semiconductor dies. The distribution element comprises at least one integrally formed circuit element that creates a difference in transmission characteristics between the first and second transmission paths.

Separately or in combination, the distribution element comprises a semiconductor substrate, a first layer of metallization disposed on the substrate, and first, second and third bond pads each being formed in the first layer of metallization, and the semiconductor package further comprises a first conductive connector electrically connecting the first upper surface terminal to the first bond pad, a second conductive connector electrically connecting the second upper surface terminal to the second bond pad, and a third conductive connector electrically connecting the first lead to the third bond pad.

Separately or in combination, the one or more integrally formed circuit elements comprise a first resistor that connects the first bond pad to the second bond pad and a second resistor that connects the first bond pad to the third bond pad, and the first resistor has a different resistance as the second resistor.

Separately or in combination, the distribution element further comprises an electrically insulating layer formed on the semiconductor substrate and a doped semiconductor layer formed on the electrically insulating layer, the first resistor is formed by a first section of the doped semiconductor layer connected between the first and second bond pads, and the second resistor is formed by a second section of the doped semiconductor layer connected between the first and third bond pads.

Separately or in combination, the semiconductor package comprises two of the semiconductor dies, the distribution element provides the first and second transmission paths between the first lead and a first one of the semiconductor dies, the distribution element provides a third transmission path for the first electrical signal between the first lead and the first bond pad of the second semiconductor die, and the distribution element provides a fourth transmission path for the first electrical signal between the first lead and the second bond pad of the second semiconductor die.

Separately or in combination, the first and second semiconductor dies are each configured as silicon carbide power transistors that are connected in parallel with one another.

Separately or in combination, the semiconductor package further comprises a second lead extending away from the die pad, the first and second semiconductor dies each comprise third bond pads that face away from the die attach surface, and the distribution element is configured to distribute a second electrical signal between the second lead and the third bond pads of the first and second semiconductor dies.

Separately or in combination, the distribution element comprises a semiconductor substrate and a first layer of metallization disposed on the substrate, a bond pad formed in the first layer of metallization, and a low-resistance metal strip formed in the first layer of metallization and connected to the bond pad, the third bond pads of the first and second semiconductor dies are directly connected to the a low-resistance metal strip, and the second lead is directly connected to the bond pad of the distribution element.

Separately or in combination, the semiconductor package comprises only one of the semiconductor dies.

Separately or in combination, the distribution element is monolithically integrated in the one semiconductor die.

Separately or in combination, the distribution element comprises a base resistance section that is mounted on the die pad and a plurality of horizontal connectors connected between the base resistance section and the first and second bond pads of the one or more semiconductor dies, the base resistance section comprises electrically resistive material with a varying thickness, and the base resistance section forms a distributed resistor network between the first lead and the first and second bond pads.

In another embodiment, the semiconductor package comprises a die pad comprising a die attach surface, a first lead extending away from the die pad, one or more semiconductor dies mounted on the die attach surface, first and second switching devices incorporated into the one or more semiconductor dies, the first and second switching devices each comprising a control terminal that faces away from the die pad, and a distribution element that is connected between the first lead and the control terminals of the first and second switching devices. The distribution element is configured to distribute a control signal from the first lead to the control terminals of the first and second switching devices.

Separately or in combination, the distribution element provides a first transmission path for the control signal between the first lead and the control terminal of the first switching device and a second transmission path for the control signal between the first lead and the control terminal of the second switching device, and the distribution element comprises one or more integrally formed circuit elements that create a difference in transmission characteristics between the first and second transmission paths.

Separately or in combination, the first and second switching devices are power transistors that are connected in parallel with one another.

Separately or in combination, the one or more integrally formed circuit elements are configured to compensate for stray inductance in the semiconductor package that causes asymmetric switching of the first and second switching devices.

Separately or in combination, the one or more integrally formed circuit elements comprise a first resistor that is connected between the first lead and the control terminal of the first switching device and a second resistor that is connected between the first lead and the control terminal of the second switching device, and the first resistor has a different resistance as the second resistor.

Separately or in combination, the semiconductor package comprises a first silicon carbide semiconductor die that comprises the first switching device and a second silicon carbide semiconductor die that comprises the second switching device.

Separately or in combination, the distribution element comprises active switching devices that are connected to the control terminals of the first and second switching devices.

Separately or in combination, the distribution element comprises a semiconductor substrate, a buried insulator layer formed in the semiconductor substrate, first and second doped shielding regions underneath the buried insulator layer and each forming a p-n junction with the semiconductor substrate, and first and second device regions of semiconductor material formed over the buried insulator layer.

Separately or in combination, the active switching devices are configured to turn off the first and second switching devices in the presence of an overvoltage across the respective output terminals of the first and second switching devices.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes FIGS. 2A and 2B, illustrates a distribution element, according to an embodiment. FIG. 2A depicts a cross-sectional view of the distribution element, and FIG. 2B depicts a plan-view of the distribution element.

FIG. 3, which includes FIGS. 3A and 3B, illustrates a distribution element, according to an embodiment. FIG. 3A depicts a cross-sectional view of the distribution element, and FIG. 3B depicts a plan-view of the distribution element.

DETAILED DESCRIPTION

Disclosed herein are embodiments of a semiconductor package with a distribution element that distributes an electrical signal between a package lead and multiple dies. The distribution element forms multiple independent transmission paths that distribute the electrical signal. The transmission characteristics of each transmission path can advantageously be tailored to obtain performance benefits. In one example, the distribution element includes a network of resistors that provide different resistances in each transmission path. This technique may be used to compensate for non-ideal effects that influence the transmission of the electrical signal, e.g., stray inductance. This compensation allows for more homogenous distribution and/or better synchronization of the electrical signal, thereby improving device performance. In one specific example, the semiconductor package includes two parallel connected power transistors, and the distribution element employs the above described compensation principle to mitigate asynchronous switching of the two devices.

Figure 1:
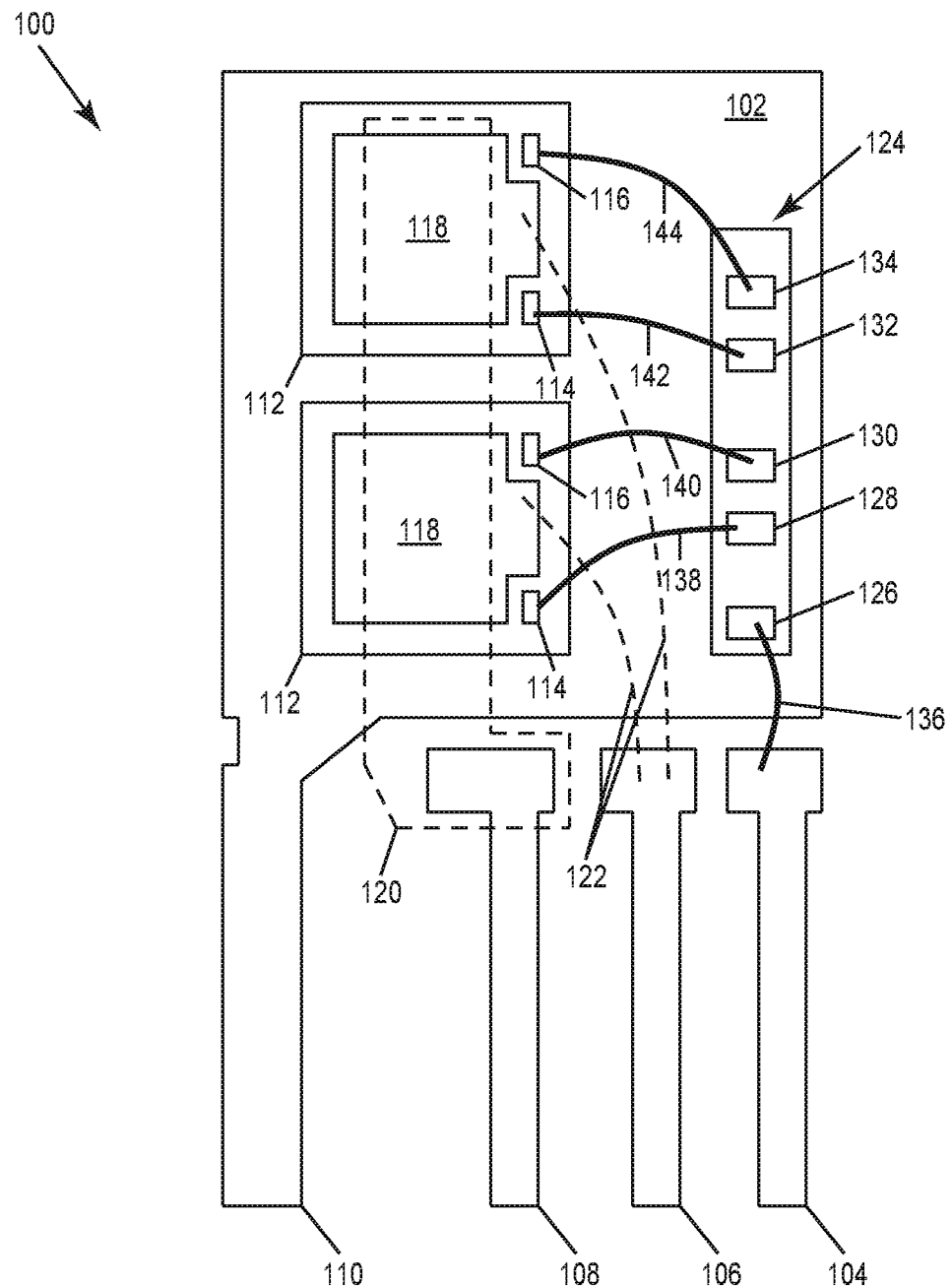
FIG. 1 illustrates a lead-frame assembly for forming a semiconductor package, according to an embodiment.

Referring to FIG. 1, a lead frame assembly 100 that is used to form a semiconductor package is depicted, according to an embodiment. The lead frame assembly 100 includes a lead frame structure formed from an electrically conductive material, e.g., copper (Cu), Aluminum (Al), Nickel (Ni), nickel phosphorous (NiP), silver (Ag), palladium (Pd), gold (Au), etc., alloys or combinations thereof. The lead frame structure includes a die pad 102 with a generally planar die attach surface. Additionally, the lead frame structure includes a plurality of leads extending away from a first side of the die pad 102. Specifically, the lead frame structure includes first, second and third leads 104, 106, 108 that are spaced apart from a first side of the die pad 102 and a fourth lead 110 that is continuously connected to the die pad 102. A completed semiconductor package is obtained by encapsulating the die pad 102 and the components mounted thereon with electrically insulating materials, e.g., ceramics, epoxy materials, thermosetting plastics, etc. The encapsulant body can be formed by a molding process such injection molding, transfer molding, compression molding, etc. In the completed package, the first, second, third and fourth leads 104, 106, 108, 110 protrude out from the encapsulant body. The die pad 102 could also be part of an isolated metal substrate (IMS), direct copper bonding (DCB), active metal bonding (AMB) or a printed circuit board (PCB).

The lead frame assembly 100 includes two semiconductor dies 112 mounted on the die attach surface of the die pad 102. The semiconductor dies 112 each include first, second and third electrically conductive bond pads 114, 116, 118 disposed upper surfaces of the semiconductor dies 112 that face away from the die pad 102. Additionally, the first and second semiconductor dies 112 each include a fourth electrically conductive bond pad (not shown) disposed on a rear surface of the semiconductor dies 112 which faces the die pad 102.

According to an embodiment, the semiconductor dies 112 are each configured as switching devices (e.g., power transistors) that are configured to control large voltages, e.g., 200 volts or more, and/or accommodate large currents, e.g., 1 ampere or more. In one particular example, the semiconductor dies 112 are configured as silicon carbide (SiC) MOSFETs that are rated to control voltages on the order of 600 volts, 1200 volts or more. In these embodiments, the first and second bond pads 114, 116 of each semiconductor die 112 can each be configured as the gate terminal of the transistor. One reason for including two separate gate pads for one transistor is to provide more homogeneous distribution of the gate potential within the semiconductor die. The third bond pads 118 can be configured as the source terminal of the transistor.

According to an embodiment, the lead frame assembly 100 is configured such that the terminals of each semiconductor die 112 are connected in parallel with one another, wherein the first, second, third and fourth leads 104, 106, 108, 110 connect to counterpart terminals of each switching device. To this end, the fourth bond pads of the semiconductor dies 112 are electrically connected to the fourth lead 110 via the die pad 102. This electrical connection can be effectuated by a conductive adhesive, e.g., solder, diffusion solder, sinter, conductive glue, etc., disposed between the die pad 102 and the rear side of each semiconductor die 112. The third bond pads 118 of each semiconductor die 112 can be electrically connected to the third lead 108 by a metal clip 120, an outline of which is shown in FIG. 1. The metal clip 120 can be a relatively wide and thick piece of conductive metal, e.g., copper, aluminum, etc., which provides low-resistance and high current carrying capacitor for the source connection. The third bond pads 118 of each semiconductor die 112 can also be separately electrically connected to the second lead 106 by conductive bond wires 122, outlines of which are shown in the figure. In this package configuration, the second lead 106 is configured as a source-sense terminal. This source-sense terminal can be used to provide a reference potential for setting the control voltages of the switching devices instead of the third lead 108. Because there is less parasitic inductance in the source-sense terminal connection, it provides a more accurate indication of the source potential than the third lead 108. The first and second bond pads 116, 116 of each semiconductor dies 112 are electrically connected to the first lead 104. This electrical connection is provided by an electrically conductive network that includes a distribution element 124, the details of which will be described in further detail below.

The distribution element 124 is configured to distribute a first electrical signal between the first lead 104 and the first and second bond pads 114, 116 of the semiconductor dies 112. This means that the first electrical signal can be transmitted from the first lead 104 to the first and second bond pads 114, 116 via the distribution element 124. Conversely, the first electrical signal can be transmitted from each one of the first and second bond pads 114, 116 to the first lead 104 via the distribution element 124. The first electrical signal can be a voltage, a current, or both.

In the depicted embodiment, the distribution element 124 is implemented as a separate element that is mounted on the die pad 102 adjacent to the semiconductor dies 112. The distribution element 124 includes first, second, third, fourth and fifth bond pads 126, 128, 130, 132, 134 that are electrically isolated from one another. The connection between the distribution element 124, the semiconductor dies 112, and the first lead 104 is effectuated by a network of conductive connectors. Specifically, the first lead 104 is electrically connected to the first bond pad 126 of the distribution element 124 by a first conductive connector 136. The first and second bond pads 114, 116 of the lower semiconductor die 112 are electrically connected to second and third bond pads 128, 130 of the distribution element 124 by second and third conductive connectors 138, 140, respectively. The first and second bond pads 114, 116 of the upper semiconductor die 114 are electrically connected to fourth and fifth bond pads 132, 134 of the distribution element 124 by fourth and fifth conductive connectors 142, 144, respectively. In the depicted embodiment, the first, second, third, fourth and fifth conductive connectors 136, 138, 140, 142, 144 are configured as bond wires. Alternatively, these conductive connectors can be implemented as metal clips, ribbons, etc.

The distribution element 124 distributes the first electrical signal between the first lead 104 and the first bond pad 114 of the lower semiconductor die 112 via a first transmission path, distributes the first electrical signal between the first lead 104 and the second bond pad 116 of the lower semiconductor die 112 via a second transmission path, distributes the first electrical signal between the first lead 104 and the first bond pad 114 of the upper semiconductor die 112 via a third transmission path, and distributes the first electrical signal between the first lead 104 and the first bond pad 114 of the upper semiconductor die 112 via a fourth transmission path.

The distribution element 124 is configured to provide independent branches for each of the above described first, second, third and fourth transmission paths. That is, the distribution element 124 forms an electrical node with each connection to the first and second bond pads 114, 116 forming a separate branch that joins the node.

According to an embodiment, the distribution element 124 includes at least one integrally formed circuit element that creates a difference in transmission characteristics between at least two of the above described first, second, third and fourth transmission paths. In this context, different transmission characteristics refers to the fact that the first electrical signal is influenced by something other than parasitic effects of a nominally low-resistance electrical connection. A difference in transmission characteristics can be caused a passive element or elements which create an intentional impedance difference between the two transmission paths, thereby creating a difference in the propagation of an identical electrical signal between the two transmission paths. Alternatively, a difference in transmission characteristics can be created by an active semiconductor device (e.g., a transistor) which can control an electrical signal or create an intentional delay in the propagation of an electrical signal.

According to an embodiment, the distribution element 124 includes a distributed network of resistors that are connected between the first, second, third, fourth and fifth bond pads 126, 128, 130 and 132. Specifically, the distribution element 124 can include a first resistor connected between the first and second bond pads 126, 128 of the distribution element 124, a second resistor connected between the first and third bond pads 126, 130 of the distribution element 124, a third resistor connected between the first and fourth 126, 132 bond pads of the distribution element 124, and a fourth resistor connected between the first and fifth bond pads 126, 134 of the distribution element 124. Thus, the first transmission path includes the first resistor, the second transmission path includes the second resistor, and so forth. In this arrangement, a difference in transmission characteristics between the respective transmission paths is created by a resistance difference in the respective resistors of each path. For example, the first resistor may have a first resistance, and the second resistor may have a second resistance that is different than the first resistance, and so forth.

The resistance values of the distributed network of resistors can be tailored to meet various performance considerations related to the propagation of the first electrical signal to the semiconductor dies 112. For example, the resistance values of the first, second, third and fourth resistors can be tailored to compensate for stray inductances of other conductive connectors within the semiconductor package that create unwanted delays. In particular, the conducive clip 120 used for the source connection can cause inductive coupling that interferes with the propagation of other signals within the package. This phenomenon can cause one of the switching devices to switch before the other, thereby incurring potentially damaging levels of current in one device. The distributed network of resistors can be configured to create a resistance difference as between the transmission paths for each semiconductor die 112, thereby mitigating asynchronous switching due to stray inductance. Additionally or alternatively, the distributed network of resistors can be configured to create a resistance difference as between the first and second bond pads 114, 116 of each semiconductor die 112, thereby providing more homogenous distribution of the first electrical signal to each semiconductor die 112.

Referring to FIG. 2, an exemplary semiconductor-based distribution element 124 configuration is depicted, according to an embodiment. The distribution element 124 includes a semiconductor substrate 200. Generally speaking, the semiconductor substrate 200 can include a wide variety of semiconductor materials including type IV semiconductors such as silicon, carbon, germanium, etc. and compound semiconductor materials, e.g., silicon carbide, silicon germanium, etc. In a preferred embodiment, the semiconductor substrate 200 includes monocrystalline silicon, e.g., Czochralski grown (CZ) silicon, magnetic-field-induced Czochralski (MCZ) silicon, float-zone (FZ) silicon, etc. The semiconductor substrate 200 can be undoped or can have a relatively low dopant concentration (i.e., P- or N-doping) on the order of $10^{13}$ dopant atoms/cm$^3$-$10^{15}$ dopant atoms/cm$^3$.

The distribution element 124 includes an electrically insulating layer 202 that is formed on an upper surface of the semiconductor substrate 200. The electrically insulating layer 202 can be a relatively thick (e.g., 1-100 μm) layer of oxide or nitride, e.g., silicon nitride (SiN), silicon dioxide (SiO$_2$) or silicon oxynitride (SiO$_x$NY), or silicate glass materials, e.g., BSG (boron silicate glass), PSG (phosphorus silicate glass) or BPSG (boron phosphorus silicate glass), etc.

The distribution element 124 includes a semiconductor layer 204 formed on the upper surface of the semiconductor substrate 200. The semiconductor layer 204 is formed to have a relatively high electrical conductivity in comparison to the semiconductor substrate 200. For example, the semiconductor layer 204 may include polycrystalline semiconductor material and/or highly doped material. For example, the semiconductor layer 204 may be a layer of polysilicon with a net n-type dopant concentration of at least $10^{17}$ dopant atoms/cm$^3$. The semiconductor layer 204 can be formed by epitaxial deposition, for example.

The distribution element 124 includes a first metallization layer 206 formed on an upper surface of the semiconductor substrate 200. The first metallization layer 206 can include conductive metals such as copper, tungsten, aluminum, etc. and alloys thereof. The first, second, third, fourth and fifth bond pads 126, 128, 130 and 132 of the distribution element 124 are formed in the first metallization layer 206. The distribution element 124 additionally includes a first elongated strip 146 that is formed in the first metallization layer 206 and connects with the first bond pad 126. Each of these features can be structured by typical processing techniques, such as selective etching.

The first, second, third and fourth resistors of the distribution element 124 are formed by discrete sections of the semiconductor layer 204 that form an electrical connection between one of the bond pads and the first elongated strip 146. Specifically, the first resistor is formed by a first section 206 of the semiconductor layer 204 that is between the second bond pad 128 and the first elongated strip 146, the second resistor is formed by a second section 208 of the semiconductor layer 204 that is between the second bond pad 128 and the first elongated strip 146, and so forth. This arrangement allows for the resistance values of the various resistors to be easily tailored by modifying the geometry of the discrete sections of the semiconductor layer 204. Specifically, the distance between the first elongated strip 146 and each of the second, third, fourth and fifth bond pads 126, 128, 130 and 132 can be individually tailored so as to define a length of each resistor. Additionally or alternatively, the thickness of the semiconductor layer 204 between the first elongated strip 146 and each of the second, third, fourth and fifth bond pads 126, 128, 130 and 132 can be individually tailored so as to define a thickness of each resistor.

The semiconductor-based distribution element 124 configuration described with reference to FIG. 2 represents a simple, yet effective mechanism for providing independent transmission paths with different and customized transmission characteristics. As the above described features can be formed by a relatively low number of well-established semiconductor processing steps, this represents a cost-effective solution for enhancing the performance of a semiconductor package. This concept is more broadly applicable to a variety of different distributed circuit element networks beyond the resistor example described above. For example, other passive components, e.g., inductors, capacitors, transmission line structures, etc., can be formed through standardized semiconductor processing steps including metal deposition, etching, etc.

The semiconductor-based distribution element 124 can contain a passivation layer (not shown), e.g., polyimide (PI), silicon nitride (SiNx) etc., above the first metallization layer 206 and/or the semiconductor layer 204. In an embodiment, the semiconductor-based distribution element 124 includes an imide-based layer e.g., polyimide (PI) wherein the bond pad portions of the first metallization layer 206 protrude through the imide based layer and the other features are covered.

Distribution element 124 can be mounted on the die pad 102 using any of a variety of standard semiconductor adhesives, e.g., solder, diffusion solder, sinter, glue, tape, etc. The semiconductor-based distribution element 124 may optionally include a rear side metallization 210 to effectuate these connections. However, a thermally and/or electrically conductive connection between the distribution element 124 and the die pad 102 is not necessary because, in many cases, the power dissipation is relatively low and there is no vertical current flowing through the semiconductor substrate 200. Thus, the semiconductor-based distribution element 124 can be mounted using a thermally and/or electrically insulating adhesive in embodiments.

Referring to FIG. 3, an exemplary semiconductor-based distribution element 124 configuration is depicted, according to another embodiment. The semiconductor-based distribution element 124 of FIG. 2 is an SOI (silicon on insulator) based design. To this end, the distribution element 124 includes a semiconductor substrate 300 and a buried insulator layer 302. The semiconductor substrate 300 can include a lightly doped semiconductor material, e.g., n-type silicon with a dopant concentration of no more than $10^{15}$ dopant atoms/cm$^3$. The buried insulator layer 202 can be a semiconductor oxide layer, e.g., silicon dioxide (SiO$_2$) silicon oxynitride (SiO$_x$N$_Y$) with a thickness of 1 μm, 10 μm, 100 μm, etc. The distribution element 124 includes shielding regions 304 disposed underneath the buried insulator layer 202. The shielding regions 304 are doped semiconductor regions with an opposite conductivity type as the semiconductor substrate. For instance, the shielding regions may be P-type regions with a dopant concentration of greater than $10^{15}$ dopant atoms/cm$^3$. The distribution element 124 includes first and second device regions 306, 308 disposed on top of the buried insulator layer 302. The first and second device regions 306, 308 may be laterally insulated from one another by a region of insulating material 310, such as silicon nitride (SiN), silicon dioxide (SiO$_2$) or silicon oxynitride (SiO$_x$N$_Y$). The first and second device regions 306, 308 may include epitaxial semiconductor material, e.g., epitaxial silicon.

The distribution element 124 of FIG. 3 may include active devices, e.g., transistors, diodes, etc., formed in the first and second device regions 306, 308 according to known techniques. The SOI based design of the distribution element 124 advantageously provides robustness for devices formed in the first and second device regions 306, 308 against very high vertical voltage gradients in the distribution element 124. This robustness is particularly beneficial in a high voltage semiconductor package, such as the parallel connected power transistor configuration described above, wherein the power semiconductor devices are biased at voltages of 600V, 1200V, or more. Because the distribution element 124 is mounted on the same die pad 102 as the power semiconductor devices, a very high voltage gradient exists across the vertical thickness of the distribution element 124 during operation. The shielding regions 304 in combination with the buried insulator layer 302 provide vertical electrical isolation for devices formed in the first and second device regions 306, 308. In another embodiment, a relatively thicker buried insulator layer 302 may be used (e.g., with a thickness of greater than 1 μm) and the shielding regions may be omitted.

The semiconductor-based distribution element 124 configuration of FIG. 3 allows for the incorporation of gate driving elements into the semiconductor package, thereby reducing detrimental parasitic effects in comparison to an arrangement wherein these gate driving elements are disposed outside of the package. For example, the active devices provided in the first and second device regions 306, 308 can be individual booster stages for driving each transistor. In another example, the active devices provided in the first and second device regions 306, 308 can be configured as overvoltage protection devices that are configured to actively turn off both devices when a certain source-drain potential threshold is reached. In another example, the SOI based distribution element 124 may be configured as a gate driver for a half-bridge circuit. Different to the parallel connected power transistor configuration described with reference to FIG. 1, a half-bridge circuit includes two switching devices connected in series with one another. In that case, the first and second device regions 306, 308 may accommodate the high-side driver and the low-side driver, respectively. In any of the above-mentioned examples, the active semiconductor devices incorporated into the first and second device regions 306, 308 can be electrically connected to the other devices in the semiconductor package using known techniques, e.g., wire bonding, integrated wiring layers, etc. Moreover, features similar or identical to the features of the distribution element 124 of FIG. 2 may be combined with the distribution element 124 features of FIG. 3, either in a single semiconductor chip or in two separate chips.

Figure 4:
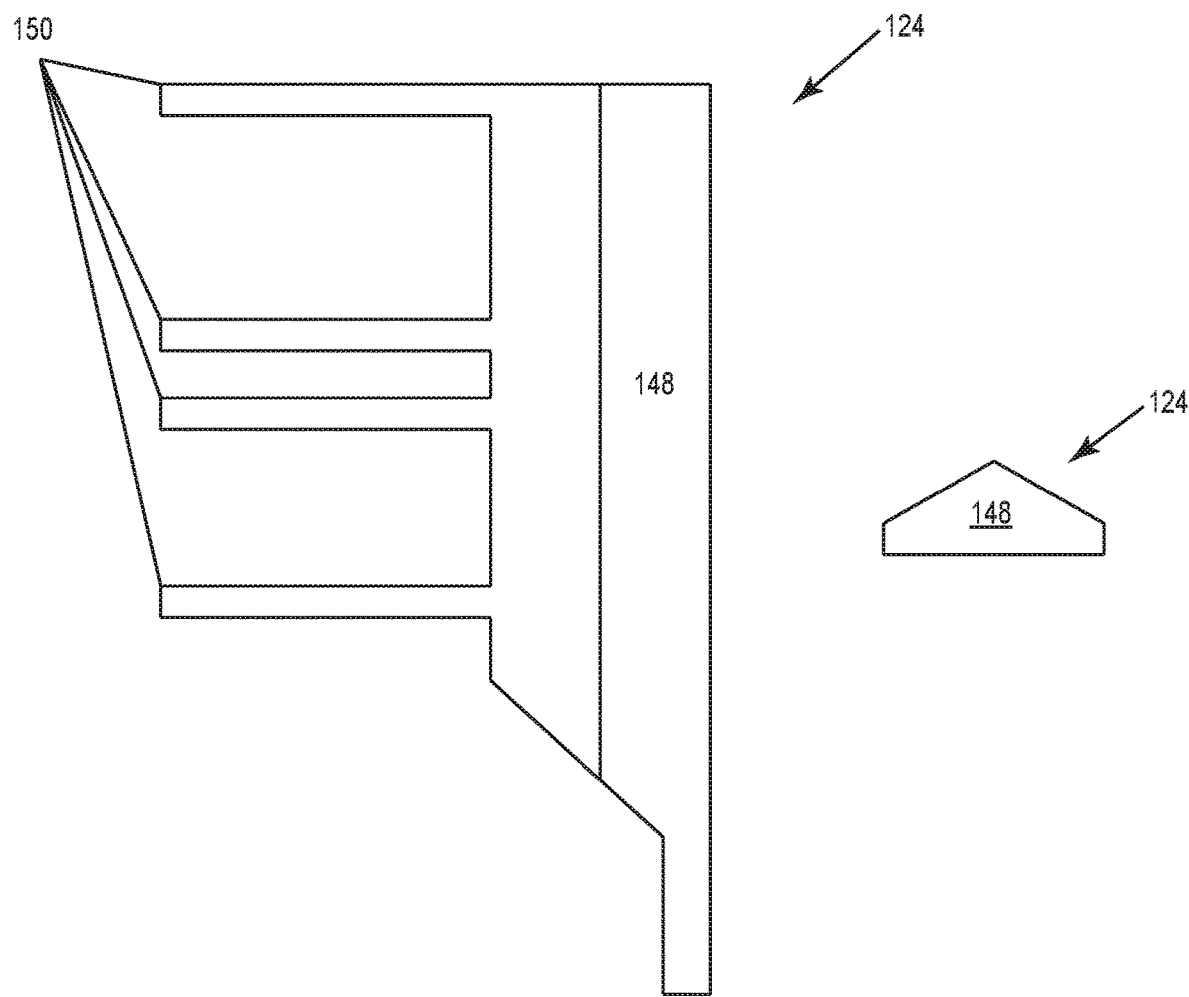
FIG. 4 illustrates a distribution element, according to an embodiment.

Referring to FIG. 4, an exemplary semiconductor-based distribution element 124 configuration is depicted, according to another embodiment. The distribution element 124 of fog. 4 is a continuous clip-like structure that can be designed to directly interface with the first lead 104 and the first and second bond pads 114, 116 of each semiconductor die 112, thereby eliminating the need for separate bond wires. The distribution element 124 includes a base resistance section 148 and a plurality of horizontal connectors 150. The distribution element 124 of FIG. 4 can be mounted with the base resistance section 148 on the die pad 102, with the lower end electrically contacting the first lead 104, and with the horizontal connectors 150 contacting the first and second bond pads 114, 116 of each semiconductor die 112.

The distribution element 124 of FIG. 4 is configured to provide a distributed network of resistors which provides separate resistance values for each transmission path between the first lead 104 and the first and second bond pads 114, 116 of each semiconductor die 112. For example, the distribution element 124 of FIG. 4 can provide a network with the first, second, third and fourth resistors as discussed above. The individual resistor values can be obtained by selecting the shape, thickness and material type of the base resistance section 148. In particular, the width of the base resistance section 148 in the horizontal direction and/or the thickness of the of the base resistance section 148 in a direction perpendicular to the die pad 102 can be selected to provide a desired resistance across the vertical connection portion. Additionally, or alternatively, individual resistor values can be tailored through selection of the connection point between the base resistance section 148 and the horizontal connectors 150.

The distribution element 124 of FIG. 4 may include a wide variety of resistive and conductive materials. Moreover, the distribution element 124 may have a homogeneous composition with different sections including different materials. Exemplary materials for the base resistance section 148 include constantan (copper-nickel alloy) and cermet (ceramic-metal composite material). Exemplary materials for the horizontal connectors 150 include conductors, e.g., sputtered metal, metal alloy, cermet, sintered resistive paste, etc. The horizontal connectors 150 may include an insulative portion (e.g., glass, ceramics, etc.) with conductive tracks formed on top of the insulative portion. In another embodiment, the horizontal connectors 150 may be replaced with conventional bond wires. The horizontal connectors 150 can be connected to the various bond pads of the semiconductor dies 112 through wire bonding techniques such as laser welding, soldering, brazing, etc.

Figure 5:
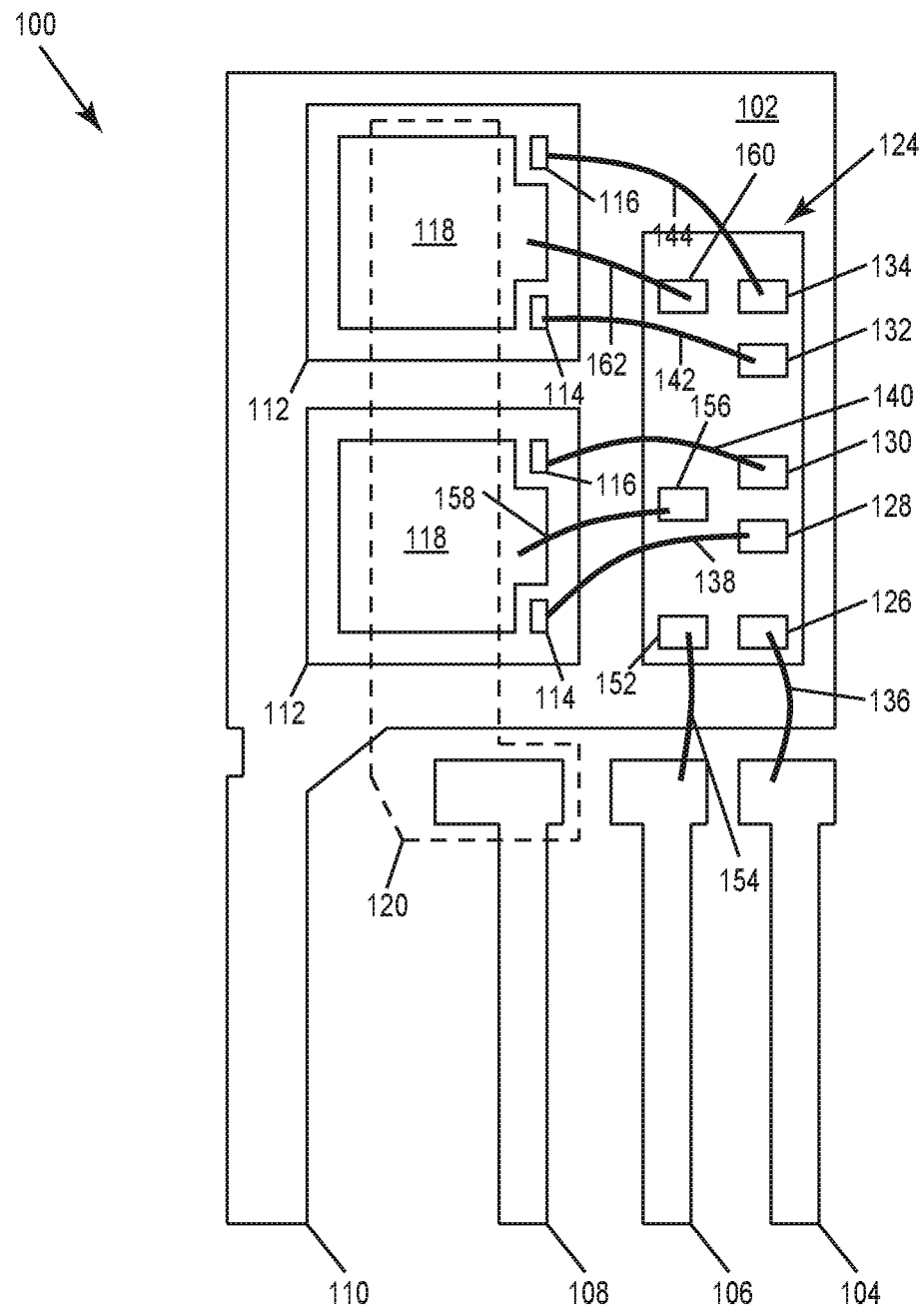
FIG. 5 illustrates a lead-frame assembly for forming a semiconductor package, according to an embodiment.

Referring to FIG. 5, a lead frame assembly 100 is depicted, according to another embodiment. The lead frame assembly 100 of FIG. 5 is substantially identical to that of FIG. 1, except that the distribution element 124 has a two-channel configuration. In this configuration, the distribution element 124 is configured to distribute a second electrical signal between the second lead 106 and the third bond pads 118 of the semiconductor dies 112, respectively. Thus, the distribution element 124 can be used to provide a source-sense connection. The second lead 106 is electrically connected to a sixth bond pad 152 of the distribution element 124 by a sixth conductive connector 154. The third bond pad 118 of the lower semiconductor die 112 is electrically connected a seventh bond pad 156 of the distribution element 124 by a seventh conductive connector 158. The third bond pad 118 of the upper semiconductor die 112 is electrically connected an eighth bond pad 160 of the distribution element 124 by an eighth conductive connector 162.

The distribution element 124 of FIG. 5 can be configured to provide independent transmission paths for the second electrical signal with different and customized transmission characteristics in a similar manner as described above. In one example of this concept, the distribution element 124 can have a semiconductor-based configuration similar to that described with reference to FIG. 2. In this case, the sixth, seventh and eight bond pads 152, 156, 160 can be formed in the first layer of metallization 206.

In an embodiment, the second channel of the distribution element 124 includes a distributed resistor network that is configured to compensate for voltage variations in the third bond pads 118 of the semiconductor dies 112. These voltage variations may arise from stray inductances in the metal clip 120 during the switching operation of the device. A distributed resistor network can be used to prevent potentially damaging currents from arising in the source-sense line.

In another embodiment, the distribution element 124 is configured to provide a continuous low-resistance connection for the second electrical signal. In that case, distribution element 124 is configured as a simple electrical node between the second lead 106 and both semiconductor dies 112. This configuration can be obtained by forming the sixth, seventh and eight bond pads 152, 156, 160 as one continuously connected region in the first layer of metallization 206. One example of this concept is illustrated in FIG. 8, which is described in further detail below.

Figure 6:
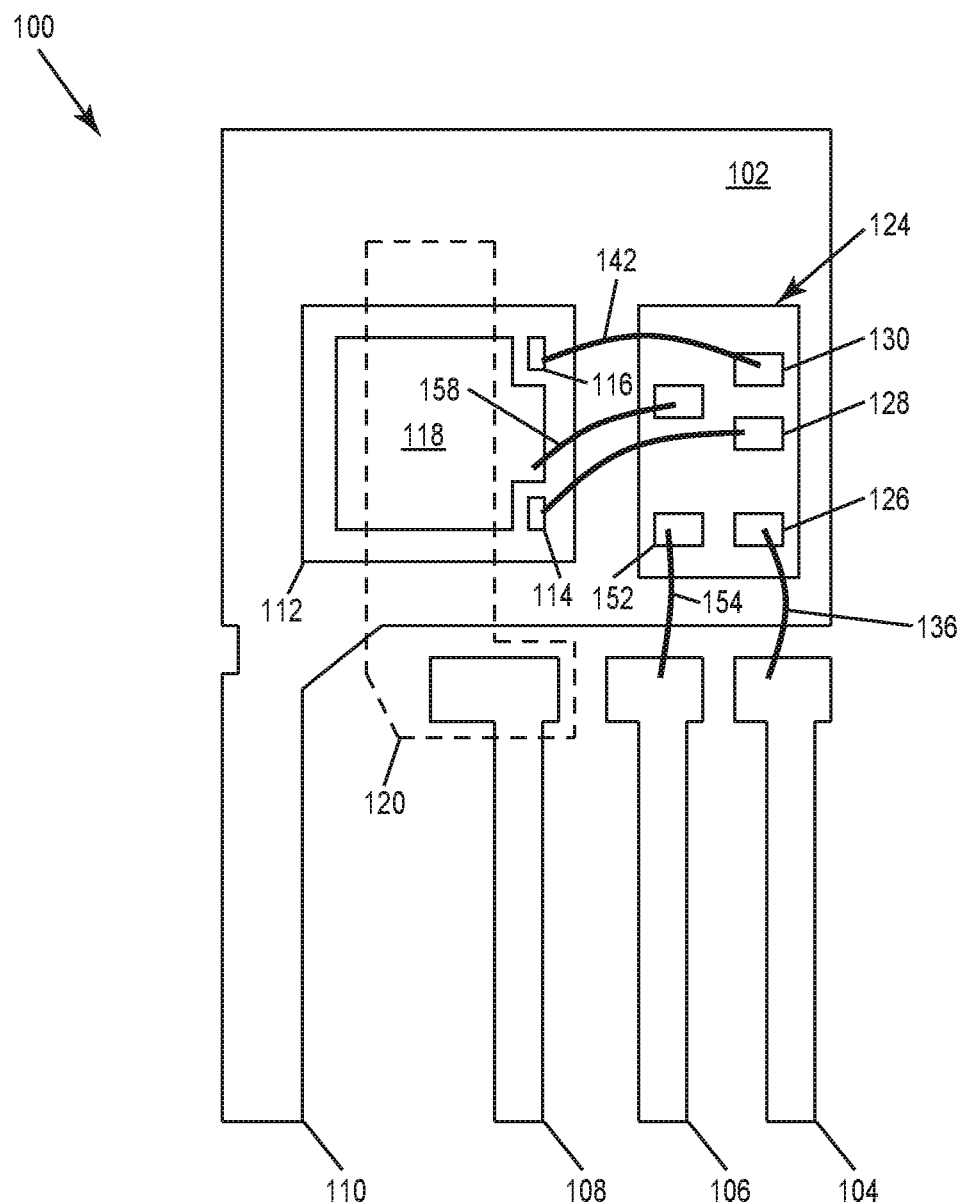
FIG. 6 illustrates a lead-frame assembly for forming a semiconductor package, according to an embodiment.

Referring to FIG. 6, a lead frame assembly 100 is depicted, according to another embodiment. The lead frame assembly 100 of FIG. 6 differs from the embodiment of FIG. 1 in that only one semiconductor die 112 is provided. The distribution element 124 is configured to distribute the first electrical signal between the first lead 104 and the first and second bond pads 114, 116 of the one semiconductor die 112. Additionally, the distribution element 124 is configured to distribute a second electrical signal between the second lead 106 and the third bonding pad 118 of the one semiconductor die 112. The distribution element 124 may include integrally formed circuit elements in the transmission paths of the first and second electrical signals in a similar manner as described above to provide the above described gate signal and source sense signal propagation.

Figure 7:
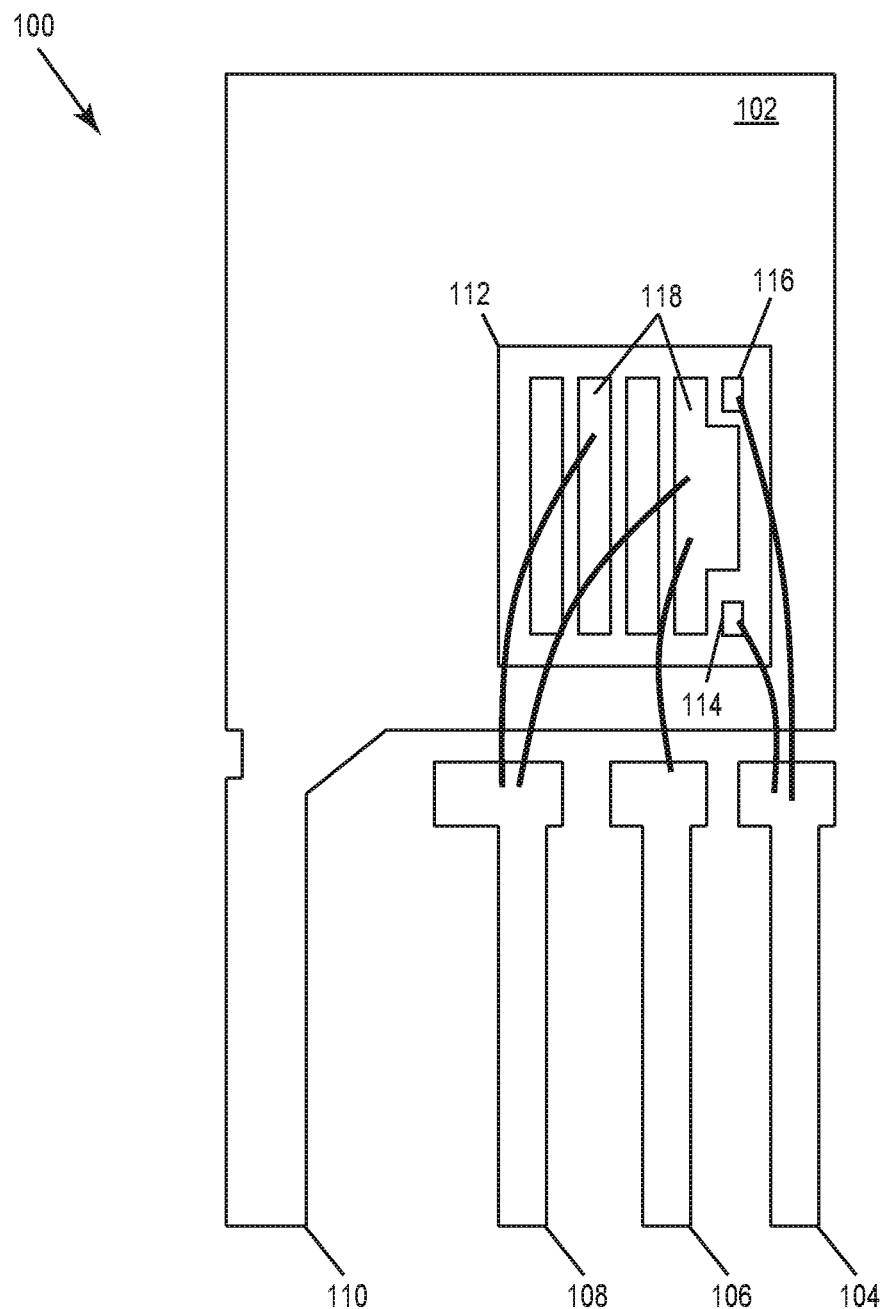
FIG. 7 illustrates a lead-frame assembly for forming a semiconductor package, according to an embodiment.

Referring to FIG. 7, a lead frame assembly 100 is depicted, according to another embodiment. The lead frame assembly 100 differs from the embodiment of FIG. 1 in that only one semiconductor die 112 is provided, and the distribution element 124 is monolithically integrated into the one semiconductor die 112. In this example, the distribution element 124 can have any of the semiconductor-based configurations described above (i.e., the embodiments of FIG. 2 or 3) incorporated into the semiconductor die. For example, the semiconductor die of FIG. 7 may include an internal network of resistors that are connected to the first and second bond pads 114, 116, wherein these resistors have a tailored resistance difference to compensate for inhomogeneity in the propagation of the gate signal.

Figure 8:
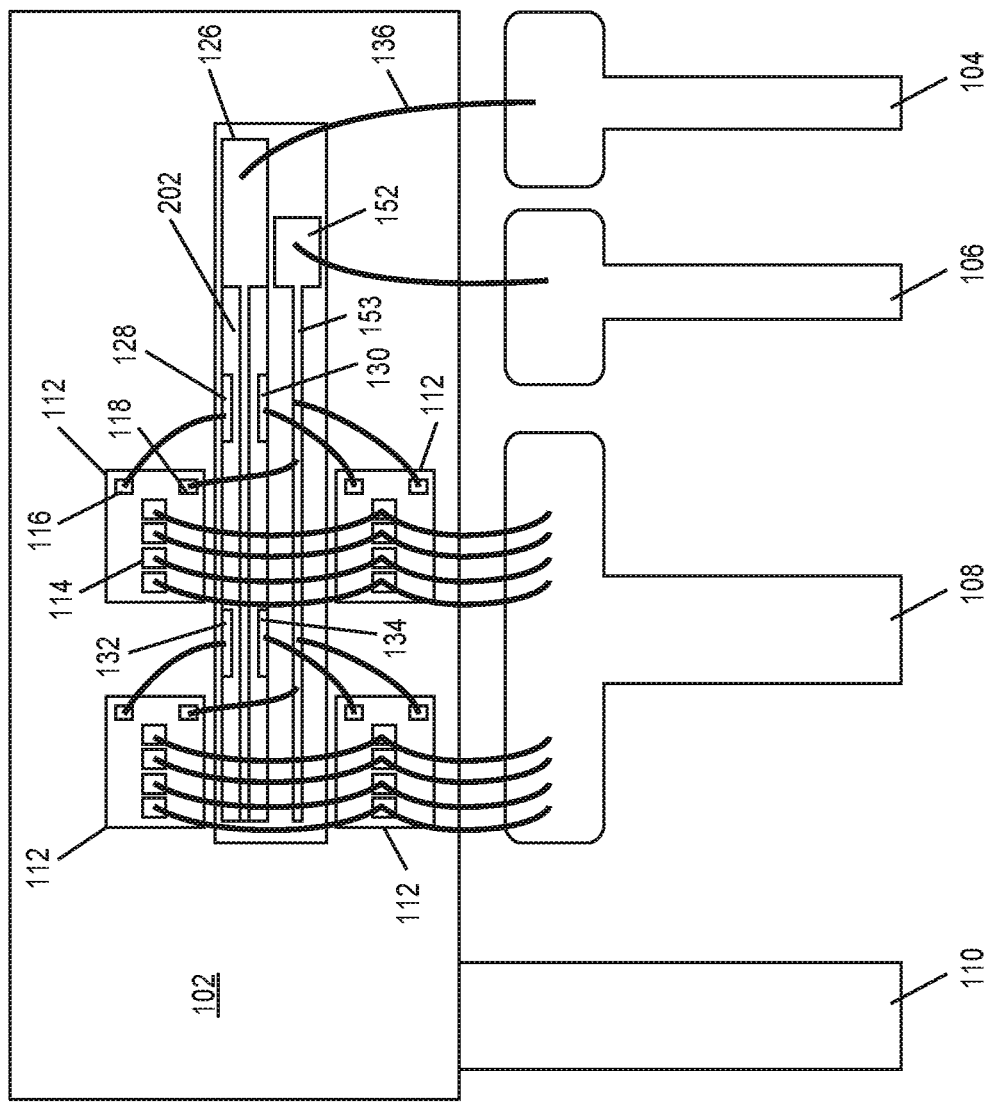
FIG. 8 illustrates a lead-frame assembly for forming a semiconductor package, according to an embodiment.

Referring to FIG. 8, and a lead frame assembly 100 is depicted, according to another embodiment. The lead frame assembly 100 of FIG. 8 includes four of the semiconductor dies 112 mounted on one die pad 102. The lead frame assembly 100 of FIG. 8 has a two-channel configuration similar to that described with reference to FIG. 5. In this configuration, the distribution element 124 is configured to distribute a second electrical signal between the second lead 106 and the third bond pads 118 of each semiconductor die. The distribution element 124 includes a low-resistance metal strip 153 that is directly electrically connected to each of the third bond pads 118 by bond wires. The low-resistance metal strip 153 can be formed in the first metallization layer 206. The low-resistance metal strip 153 directly adjoins the sixth bond pad 152, which in turn is directly electrically connected to the second lead 106 by a bond wire. Thus, the distribution element 124 is configured to distribute the second electrical signal by providing a low resistance conduction path between the second lead 106 and each of the third bond pads 118.

The distribution element concepts described herein are applicable to a wide variety of semiconductor package configurations beyond the specific parallel-connected power transistor with a source-sense terminal connection configuration used in the above exemplary embodiments. Examples of other device configurations that can include the distribution element 124 according to the concepts described herein include the following. The semiconductor dies 112 may be configured such that the second bond pad 116 is a source pad. In that case, the distribution element 124 may be configured to provide only two independent transmission paths for the first electrical signal, namely, the gate connection for the upper die 112 and the gate connection for the lower die 112. The distribution element 124 may be provided in a similarly configured three-terminal package wherein the source-sense terminal (i.e., the second lead 106) is omitted. More broadly, the distribution element 124 may be provided in a wide variety of discrete power package designs with a variety of different lead configurations (e.g., through hole, surface mount, leadless, etc.).

Moreover, the distribution element 124 concept can be incorporated into other types of devices aside from lead frame style packages. For example, an isolated metal substrate (IMS), direct copper bonding (DCB) substrate, active metal bonding (AMB) substrate or a printed circuit board (PCB) can be used, wherein the semiconductor dies 112 are mounted on any of these elements and one or more distribution elements 124 provide transmission and redistribution of electrical signals in the manner described herein. In one specific example, the arrangement of the semiconductor die 118 or dies 118 and the distribution element 124 on the die pad 102 as described herein is provided on the metal bond pad of an IMS, DCB, AMB or PCB.

The semiconductor dies 112 used in combination with the distribution element 124 can have many different device configurations. For example, the semiconductor dies 112 can be configured as diodes, insulated gate bipolar transistors (IGBTs), high electron mobility transistors (HEMTs), etc. Further, the semiconductor dies 112 can be formed in a wide variety of material technologies, e.g., silicon, silicon carbide (SiC), silicon germanium (SiGe), gallium nitride (GaN), gallium arsenide (GaAs), etc.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

The invention claimed is:

1. A semiconductor package, comprising:
a die pad comprising a die attach surface;
a first lead extending away from the die pad;
one or more semiconductor dies mounted on the die attach surface, the one or more semiconductor dies comprising first and second bond pads that each face away from the die attach surface; and
a distribution element that provides a first transmission path for a first electrical signal between the first lead and the first bond pad of the one or more semiconductor dies and a second transmission path for the first electrical signal between the first lead and the second bond pad of the one or more semiconductor dies, and
wherein the distribution element comprises at least one integrally formed circuit element that creates a difference in transmission characteristics between the first and second transmission paths.

2. The semiconductor package of claim 1, wherein the distribution element comprises a semiconductor substrate, a first layer of metallization disposed on the substrate, and first, second and third bond pads each being formed in the first layer of metallization, and wherein the semiconductor package further comprises:
a first conductive connector electrically connecting the first upper surface terminal to the first bond pad;
a second conductive connector electrically connecting the second upper surface terminal to the second bond pad; and
a third conductive connector electrically connecting the first lead to the third bond pad.

3. The semiconductor package of claim 2, wherein the one or more integrally formed circuit elements comprise a first resistor that connects the first bond pad to the second bond pad and a second resistor that connects the first bond pad to the third bond pad, and wherein the first resistor has a different resistance as the second resistor.

4. The semiconductor package of claim 3, wherein the distribution element further comprises an electrically insulating layer formed on the semiconductor substrate and a doped semiconductor layer formed on the electrically insulating layer, wherein the first resistor is formed by a first section of the doped semiconductor layer connected between the first and second bond pads, and wherein the second resistor is formed by a second section of the doped semiconductor layer connected between the first and third bond pads.

5. The semiconductor package of claim 1, wherein the semiconductor package comprises two of the semiconductor dies, wherein the distribution element provides the first and second transmission paths between the first lead and a first one of the semiconductor dies, wherein the distribution element provides a third transmission path for the first electrical signal between the first lead and the first bond pad of the second semiconductor die, and wherein the distribution element provides a fourth transmission path for the first electrical signal between the first lead and the second bond pad of the second semiconductor die.

6. The semiconductor package of claim 5, wherein the first and second semiconductor dies are each configured as silicon carbide power transistors that are connected in parallel with one another.

7. The semiconductor package of claim 5, wherein the semiconductor package further comprises a second lead extending away from the die pad, wherein the first and second semiconductor dies each comprise third bond pads that face away from the die attach surface, and wherein the distribution element is configured to distribute a second electrical signal between the second lead and the third bond pads of the first and second semiconductor dies.

8. The semiconductor package of claim 7, wherein the distribution element comprises a semiconductor substrate and a first layer of metallization disposed on the substrate, a bond pad formed in the first layer of metallization, and a low-resistance metal strip formed in the first layer of metallization and connected to the bond pad, wherein the third bond pads of the first and second semiconductor dies are directly connected to the a low-resistance metal strip, and wherein the second lead is directly connected to the bond pad of the distribution element.

9. The semiconductor package of claim 1, wherein the semiconductor package comprises only one of the semiconductor dies.

10. The semiconductor package of claim 9, wherein the distribution element is monolithically integrated in the one semiconductor die.

11. The semiconductor package of claim 1, wherein the distribution element comprises a base resistance section that is mounted on the die pad and a plurality of horizontal connectors connected between the base resistance section and the first and second bond pads of the one or more semiconductor dies, wherein the base resistance section comprises electrically resistive material with a varying thickness, and wherein the base resistance section forms a distributed resistor network between the first lead and the first and second bond pads.

12. A semiconductor package, comprising:
a die pad comprising a die attach surface;
a first lead extending away from the die pad;
one or more semiconductor dies mounted on the die attach surface;
first and second switching devices incorporated into the one or more semiconductor dies, the first and second switching devices each comprising a control terminal that faces away from the die pad; and
a distribution element that is connected between the first lead and the control terminals of the first and second switching devices, and
wherein the distribution element is configured to distribute a control signal from the first lead to the control terminals of the first and second switching devices, wherein the distribution element provides a first transmission path for the control signal between the first lead and the control terminal of the first switching device and a second transmission path for the control signal between the first lead and the control terminal of the second switching device, and wherein the distribution element comprises one or more integrally formed circuit elements that create a difference in transmission characteristics between the first and second transmission paths.

13. The semiconductor package of claim 12, wherein the first and second switching devices are power transistors that are connected in parallel with one another.

14. The semiconductor package of claim 13, wherein the one or more integrally formed circuit elements are configured to compensate for stray inductance in the semiconductor package that causes asymmetric switching of the first and second switching devices.

15. The semiconductor package of claim 14, wherein the one or more integrally formed circuit elements comprise a first resistor that is connected between the first lead and the control terminal of the first switching device and a second resistor that is connected between the first lead and the control terminal of the second switching device, and wherein the first resistor has a different resistance as the second resistor.

16. The semiconductor package of claim 13, wherein the semiconductor package comprises a first silicon carbide semiconductor die that comprises the first switching device and a second silicon carbide semiconductor die that comprises the second switching device.

17. The semiconductor package of claim 12, wherein the distribution element comprises active switching devices that are connected to the control terminals of the first and second switching devices.

18. The semiconductor package of claim 17, wherein the distribution element comprises a semiconductor substrate, a buried insulator layer formed in the semiconductor substrate, first and second doped shielding regions underneath the buried insulator layer and each forming a p-n junction with the semiconductor substrate, and first and second device regions of semiconductor material formed over the buried insulator layer.

19. The semiconductor package of claim 17, wherein the active switching devices are configured to turn off the first and second switching devices in the presence of an overvoltage across the respective output terminals of the first and second switching devices.

* * * * *

UNITED STATES PATENT AND TRADEMARK OFFICE
CERTIFICATE OF CORRECTION

| | |
|---|---|
| PATENT NO. | : 11,721,616 B2 |
| APPLICATION NO. | : 16/892773 |
| DATED | : August 8, 2023 |
| INVENTOR(S) | : Voss et al. |

It is certified that error appears in the above-identified patent and that said Letters Patent is hereby corrected as shown below:

In the Claims

Column 14, Line 34 (Claim 8, Line 8) please change "to the a" to -- to the --

Signed and Sealed this
Twenty-sixth Day of September, 2023

Katherine Kelly Vidal
*Director of the United States Patent and Trademark Office*